May 14, 1968 R. P. GRENIER 3,383,625

SYSTEM FOR GENERATING A SMOOTHLY AND CONTINUOUSLY VARYING SIGNAL HAVING A VARIABLE FREQUENCY

Filed Oct. 4, 1966 2 Sheets-Sheet 1

INVENTOR
R. P. GRENIER
By R. P. Miller
ATTORNEY 3,383,625

SYSTEM FOR GENERATING A SMOOTHLY AND CONTINUOUSLY VARYING SIGNAL HAVING A VARIABLE FREQUENCY

Robert P. Grenier, Newburyport, Mass., assignor to Western Electric Company, Incorporated, New York, N.Y., a corporation of New York Filed Oct. 4, 1966, Ser. No. 584,226
4 Claims. (Cl. 331—178)

ABSTRACT OF THE DISCLOSURE

A sweep frequency generator includes two fixed frequency oscillators, which respectively regulate upper and lower sweep frequency limits for a variable frequency oscillator. A mixer and a band-pass filter are associated with each fixed frequency oscillator for passing a beat frequency only upon the variable frequency oscillator reaching the respective desired frequency limit. Passed beat frequencies from alternating filters successively trigger a bistable multivibrator between alternative states of operation. A triangular wave generator is coupled to the bistable multivibrator and functions to alternatingly increase and decrease a control voltage applied to the variable frequency oscillator as alternating limit frequencies are attained.

This invention relates to a system for generating a smoothly and continuously varying signal having a variable frequency and more particularly to a system of this type wherein upper and lower output frequency limits may be accurately controlled with high stability.

In the testing of crystal filters, it is desirable to provide a smoothly and continuously varying signal having a variable or sweep frequency with accurately controlled upper and lower frequency limits. Typically, a tolerance of $\pm 0.0025\%$ is desired for the limiting frequencies. Additionally, the operation of the system must be sufficiently stable to maintain the accuracy of the frequency limits during repeated operations of the system.

It is an object of the invention to provide a new and improved system for generating a smoothly and continuously varying signal having a variable frequency.

It is also an object of the invention to provide such a system with upper and lower output frequency limits controlled to a high degree of accuracy.

Another object of the invention is to provide a system of this type wherein the accuracy of the limiting frequencies is maintained stable during repeated operations of the system.

Another object of the invention resides in a tuned network controlled oscillator having facilities for continually varying the resonant frequency characteristics of the network so that the frequency of an output signal varies between precise upper and lower limits.

A further object of the invention is the provision of a sweep frequency generator wherein a bistable circuit is switched from one stable state to another in response to predetermined upper and lower frequencies of an output signal and wherein the bistable circuit initiates operation of triangular waveform generator to vary the inductive reactance of a tuned circuit controlled oscillator that in turn produces the output signal which progressively increases and decreases in frequency.

With these and other objects in view, the invention contemplates the use of a voltage controlled oscillator for providing the desired variable signal. Two fixed frequency oscillators are also used, one operating at a frequency above the desired upper frequency limit and the other operating below the desired lower frequency limit. A mixer and a bandpass filter are associated with each fixed frequency oscillator. As the output signal frequency of the voltage controlled oscillator approaches either desired frequency limit, it differs from the output frequency of one of the fixed frequency oscillators by a continuously decreasing difference. The associated mixer is continuously generating a signal having as one component thereof a beat frequency equal to this continuously decreasing difference. The associated band-pass filter functions to filter out all frequencies except the difference frequency component upon its decreasing to a predetermined value. The passed difference frequency signal triggers a bistable multivibrator to another state of operation. A square wave voltage output signal from the bistable multivibrator is continuously integrated by a triangular wave generator so as to provide a rising amplitude voltage output for one state of the bistable multivibrator operation and a falling or decreasing amplitude voltage output for the other state. The output voltage of the triangular wave generator is used as a varying input for the voltage controlled oscillator. The outputs from the filters act alternately to trigger the bistable multivibrator so as to vary the output frequency of the voltage controlled oscillator away from each frequency limit as it is reached.

In an alternative embodiment, a single fixed frequency oscillator may be used. This oscillator operates at a desired mean frequency. A single mixer generates a varying difference frequency equal to the difference between the desired mean frequency and the varying frequency output of a voltage controlled oscillator. A single band-pass filter passes a difference frequency of predetermined value to a bistable multivibrator to trigger it to an alternate mode of operation. A square wave voltage output of bistable multivibrator is integrated by a triangular wave generator to provide a varying voltage to serve as an input for the voltage controlled oscillator.

Other objects and advantages of the invention will be apparent from the following detailed description when considered in conjunction with the drawing wherein.

Figure 1:
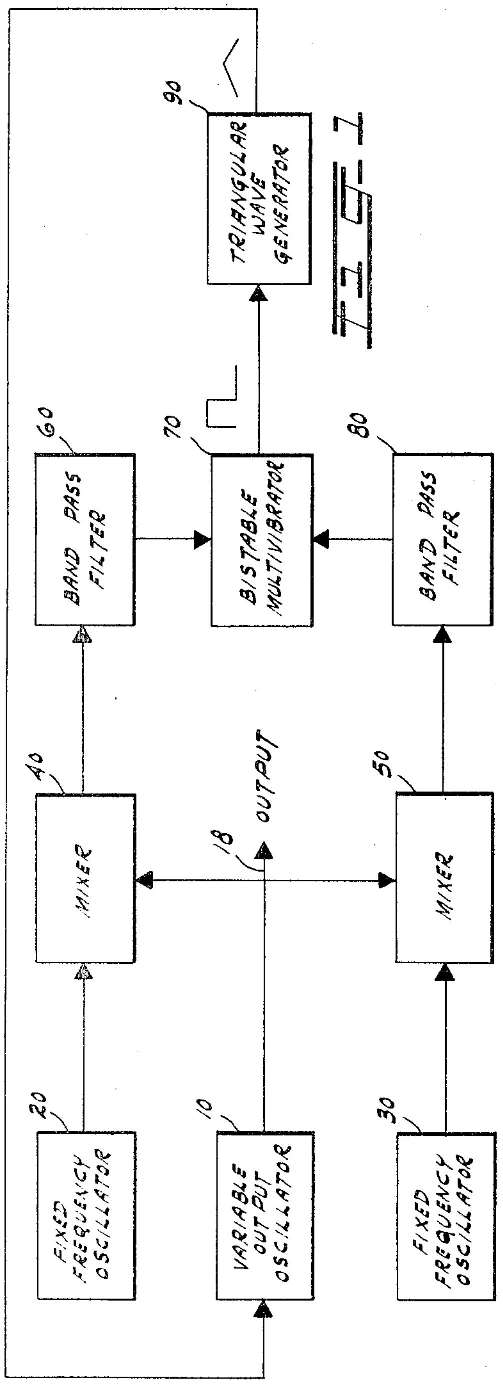
FIG. 1 is a block diagram illustrating a sweep frequency generator embodying the principles of the invention.

Referring first to FIG. 1, a variable output oscillator 10 is controlled to provide an output signal with a frequency varying between precisely defined upper and lower limits. The variable output oscillator 10 is of a type which will produce a varying output signal having its frequency varying with a voltage input to an oscillator control element. The frequency variation may be directly or indirectly proportional to the voltage input.

Two additional oscillators 20 and 30 are employed in setting the upper and lower limiting frequencies. Oscillator 20 operates to produce an output signal having a fixed frequency which is slightly above the desired upper frequency limit for the variable output oscillator 10. Oscillator 30 operates to produce an output signal having a fixed frequency which is slightly below the desired lower frequency limit for the variable output oscillator 10. The fixed frequency oscillators 20 and 30 may be of a number of commercially available types. The accuracy and stability of the entire system is largely dependent upon the accuracy and stability of these precise, fixed frequency oscillators. Temperature controlled ovenized crystal oscillators are, therefore, preferred, due to the high accuracy and stability characteristics of this type of oscillator.

A pair of mixers 40 and 50 is also utilized. The mixer 40 is associated with oscillator 20 and the mixer 50 is associated with oscillator 30. Each mixer functions to continuously generate a signal having a frequency component which corresponds to the difference between the two signal frequencies applied thereto. The output signals of oscillators 10 and 20 serve as input signals to the mixer 40, while the mixer 50 receives the output signals from oscillators 10 and 30. As the frequency of the signal from the variable output oscillator 10 approaches that of one of the fixed frequency oscillators 20 or 30, the mixer 40 or 50 associated therewith generates a signal having a difference frequency component which continuously decreases in frequency.

Each mixer has associated therewith a band-pass filter 60 or 80. Filter 60 receives the difference frequency signal from the mixer 40 and filter 80 receives the difference frequency signal from the mixer 50. Each filter is preferably of a type which will pass only those signals which are within a range of a few cycles per second on either side of a fixed frequency. The lower the fixed frequency selected for each filter, the lower will be the number of cycles per second constituting this range and the more accurate will be the frequency limits afforded for the variable output oscillator 10.

A bistable multivibrator 70 is also used. The multivibrator is of a type which is switched from state to state by the application of trigger signals to alternate control elements. Each filter 60 or 80 is connected to one of the control elements to pass a trigger signal thereto. The trigger signal passed by the filter is merely a difference frequency component, generated by the associated mixer 40 or 50, which has decreased in frequency sufficiently to fall within the band-pass region of the filter. The bistable multivibrator 70 produces output signals having a square waveform.

A triangular wave generator 90 receives the square wave output signal of the bistable multivibrator 70. The triangular wave generator is an integrating circuit which produces a triangular wave output signal, the voltage steadily rising for one state of the bistable multivibrator and steadily falling or decreasing for the other state. The output of the triangular wave generator 90 is fed back to the variable output oscillator 10 to control the output thereof. Thus, the triggering of the bistable multivibrator 70 to an alternate state of operation will cause the triangular wave generator 90 to reverse the direction of its output signal variation. This will, in turn, cause the output signal frequency from the variable oscillator 10 to begin to decrease, if it was formerly increasing, or to increase, if it was formerly decreasing.

The frequency of the signal generated by the above-described system will continue to vary between selected upper and lower limits. The limits may be precisely defined by a careful selection of operating frequencies for the fixed frequency oscillators 20 and 30 and of the bandpass filters 60 and 80.

Figure 2:
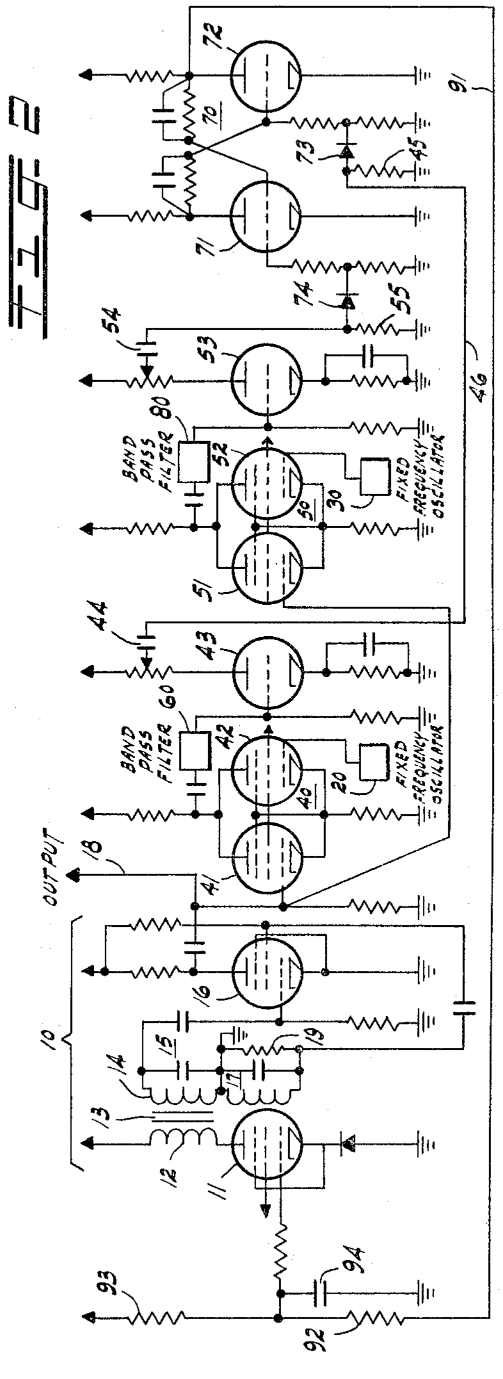
FIG. 2 is a schematic diagram of the sweep frequency generator corresponding to the block diagram of FIG. 1 and particularly showing a controlled frequency oscillator varied between selected frequency limits by switching a bistable circuit when the frequency reaches either of the frequency limits to reverse the direction in which the frequency of the oscillator is varying.

Considering now the details of the circuit modules shown in FIG. 1, and with particular reference to FIG. 2, the application of power to the circuits causes conduction of either triode 71 or 72 of the bistable multivibrator 70. For sake of explanation, assume that triode 71 starts to conduct and triode 72 does not conduct. The voltage appearing at the anode of the triode 72 is impressed over a lead 91 to one side of a resistor 92. The other side of the resistor 92 forms a junction with one side of a grounded capacitor 94, and also, with one side of a resistor 93, the other side of which is returned to a negative voltage source. The capacitor 94, taken together with resistors 92 and 93, forms a conventional exponential charging circuit so that an exponentially rising voltage appears across the capacitor 94. The circuit parameters are selected so that only that portion of the exponential voltage is utilized which closely approximates and can be considered a linearly rising voltage. This positive rising voltage across the capacitor 94 is applied to a control tube 11 biased at an operating point so that the plate current thereof increases in response to the positive rising voltage applied thereto.

Connected in the anode circuit of the tube 11 is a primary coil 12 of a transformer coupled through a nonlinear magnetic core 13 to a secondary coil 14 included in a high Q, narrow band tuned network 15. As the current flow increases through the coil 12, there is an increase in flux and saturation of the core 13, thereby increasing the resonant frequency of the tuned net work 15.

The tuned network 15 is connected between a control grid and a cathode of a pentode 16. Connected in series with network 15 is a low Q, wide band tuned network 17 which is further connected between a screen grid and the cathode of the pentode. The stray capacitance between the screen grid and control grid of the pentode 16, together with the resonant networks 15 and 17, constitute a tuned grid-tuned suppressor Hartley type oscillator, the output of which is sinusoidally varying and is impressed over a lead 18 to a utilization device, such as a test circuit for quartz crystals.

The resonant network 17 includes a parallel connected resistor 19 to load and allow this resonant circuit to respond to a relatively wide band of frequencies. This wide band response of the tuned network 17 is selected to encompass all of the frequencies to which the network 15 will be required to respond. It will be recalled that the frequency response of the network 15 varies inversely with the inductance reactance of the coil 14, which in turn varies in response to the varying saturation of the core 13 due to the increasing current flow through the control tube 11.

In a like manner, when the current flow through the control tube 11 decreases, there will be a corresponding decrease in flux and saturation of the core 13 so that there is an increase in the inductive reactance effect of the coil 14 resulting in a corresponding decrease in the resonant frequency at which response is attained by the tuned network 15. In summary, the output of the pentode 16 will vary in frequency in direct proportion to the varying current flow through the control tube 11.

The output of the pentode 16 is also applied to both the mixers 40 and 50, each of which includes a pair of tubes 41 and 42, and 51 and 52, respectively. The control grids of the tubes 41 and 51 receive the varying frequency output of the oscillating pentode 16, whereas the control grids of the tubes 42 and 52, respectively, receive (1) the high frequency output from the fixed, stable oscillator 20, and (2) the low frequency output of the fixed, stable oscillator 30. Assume that the frequency output of the oscillating pentode 16 is increasing, then, there is a varying spectrum of frequencies including a difference frequency being impressed on the common anode circuit of the mixer tubes 41 and 42. When there is a difference frequency of a predetermined value, the band-pass filter 60 responds by applying an output signal, a sinusoidal burst of voltage to the control grid of a triode 43. This triode has a cathode bias resistor and a bypass capacitor so that the tube is biased into its operating region. The tube 43 amplifies the burst of voltage coming from the filter 16. The amplifier signal is differentiated by a capacitor 44 and a resistor 45 to apply negative and positive-going voltage spikes over a lead 46 running to a diode 73 connected to the grid of the tube 72 of the bistable multivibrator 70. The positive-going voltage spike passes through diode 73 and tube 72 commences conduction and in so doing, the accompanying drop in its anode potential is fed across to the control grid of the tube 71, thereby cutting this tube off and switching the multivibrator to its other stable state.

When the tube 72 of the multivibrator 70 commences conduction, the current flow through the resistor 92 is greatly reduced due to the saturation of the triode 72, resulting in a reduction of voltage across the resistor 92. Now the capacitor 94 discharges through resistor 93 toward the negative voltage source, and as a result, the conduction of control tube 11 decreases to reduce the amount of current flow through the inductance coil 12. This reduction in current flow and the decrease in flux and saturation of the core 13 results in an increase in the inductive reactive effect of the coil 14. As a result, the resonant frequency response of the tuned circuit 15 will decrease so that the frequency output of the pentode 16 is decreased.

The steadily decreasing frequency output of the pentode 16 is applied to a control grid of the tube 51. The output of the tube 51 is mixed with the output from the tube 52 controlled by the fixed frequency oscillator 30. When a predetermined difference frequency is impressed in the common anode circuit, the band-pass filter 80 responds in passing a signal which is a sinusoidal burst of voltage to a control grid of an amplifier tube 53. Tube 53 is identical to tube 43 having a cathode bias resistor and a bypass capacitor so that tube 53 amplifies the burst of voltage coming from the filter 80. The amplified voltage is applied through a differentiating network including capacitor 54 and resistor 55 to a diode 74. The positive-going portion of the differentiated potential passes through the diode 74 to render the tube 71 conductive, and thus switch the stable states of operation of the multivibrator. The circuit is now in condition to exercise a subsequent cycle of operation.

It will be appreciated that the output frequency appearing on lead 18 will progressively increase to a predetermined value and then decrease to a second predetermined value. Obviously, the upper and lower limits of the sweep frequency impressed on lead 18 may be changed by varying or replacing a number of circuit parameters, such as the bandpass filters, the frequency outputs of the fixed oscillators, and other circuit modules or elements.

Figures 3, 4:
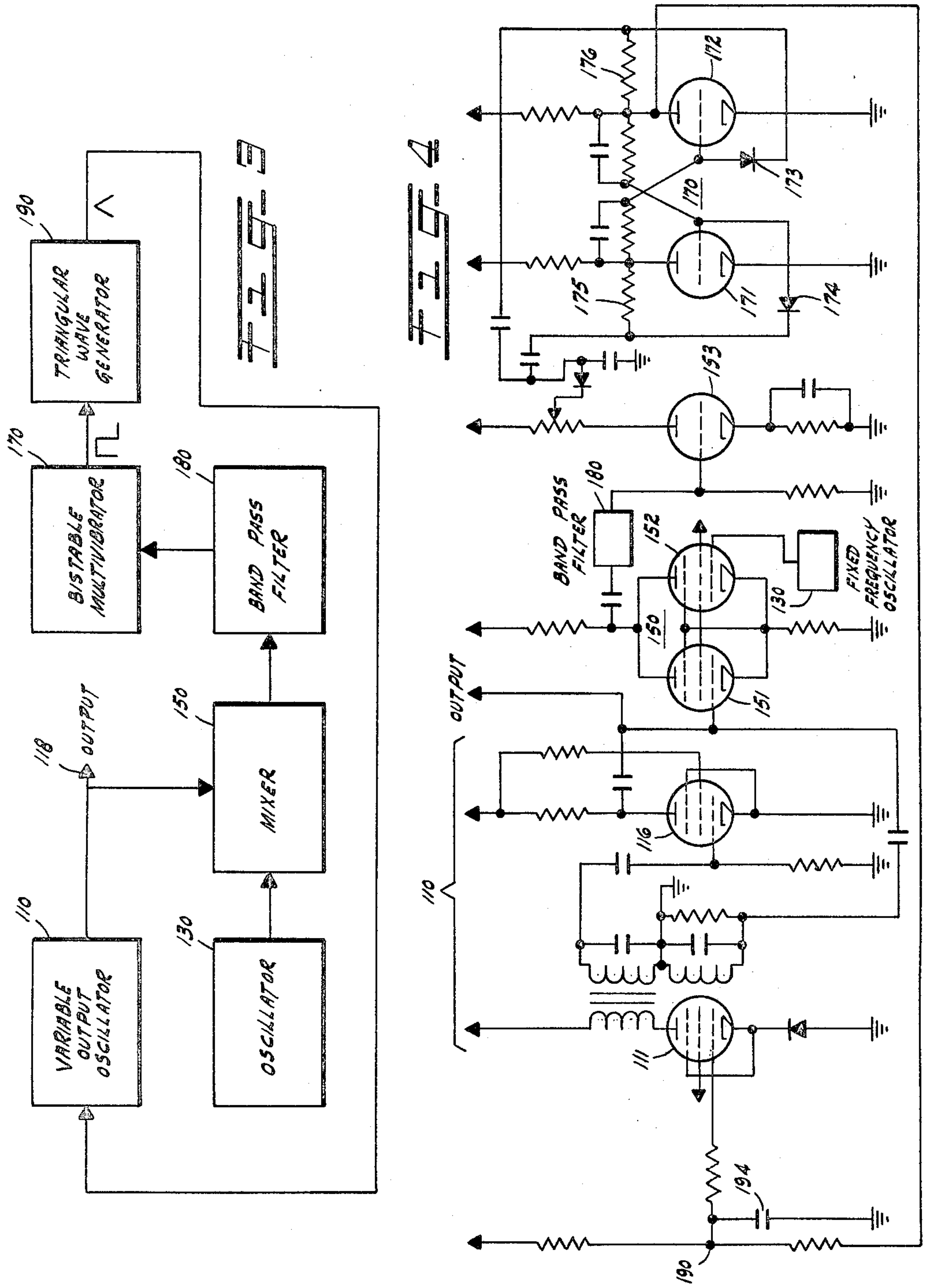
FIG. 3 is a block diagram of another sweep frequency generator illustrating an alternative embodiment of the invention.
FIG. 4 is a schematic circuit diagram of a system corresponding to the alternative embodiment block diagram of FIG. 3 and particularly showing a sweep frequency generator, similar to the generator of FIG. 2, wherein a single mixer and a single filter are employed.

An alternate embodiment is shown in block diagram form in FIG. 3. This embodiment employs only a single fixed frequency oscillator 130, a single mixer 150, and a single band-pass filter 180.

A variable output oscillator 110, similar to the oscillator 10 of FIG. 1, and a fixed frequency oscillator 130, similar to oscillator 30, are used. The fixed frequency oscillator 130 is set to operate to produce a signal having a frequency equal to the mean frequency desired for the signal produced by the variable output oscillator 110. A mixer 150, similar to the mixer 50 of FIG. 1, and a band-pass filter 180, similar to filter 80, are also utilized. Filter 180, however, operates to pass a band width at a substantially higher frequency than does filter 80. The embodiment of FIG. 3 also employs a bistable multivibrator 170, similar to the bistable multivibrator 70, which is triggered back and forth between states by a signal applied to a single input. A triangular wave generator 190, similar to the triangular wave generator 90, functions to integrate the square waveform produced by the bistable multivibrator 170 to provide an input for the variable output oscillator 110.

This system operates as follows. Assume, first, that the output voltage signal delivered by triangular wave generator 190 to the variable output oscillator 110 is continuously increasing in magnitude. The frequency of the output signal of the oscillator 110 is, thus, also continuously increasing. Assume, also, that this rising output signal frequency is presently above the lower frequency limit thereof.

The difference between the frequncies of the output signals of oscillators 110 and 130 is too small for a beat frequency component of the signal generated by the mixer 150 to be passed by the band-pass filter 180. The frequency of the signal produced by the variable output oscillator 110, therefore, continues to increase. The frequency difference decreases until the frequencies of the output signals of the oscillators 110 and 130 become equal, then rises again as the frequency of the oscillator 110 output signal increases further. At the desired frequency limit, the mixer 150 generates a signal having as a component a beat frequency which is large enough to be passed by bandpass filter 180 to trigger the bistable multivibrator 170 to its other state of operation. The triangular wave generator 190, integrating the changed output signal of the bistable multivibrator, thus begins to deliver a constantly decreasing voltage signal to the variable output oscillator 110 to cause the signal produced thereby to start decreasing in frequency.

The frequency of the output signal produced by the variable output oscillator continues to decrease, causing the magnitude of the difference between the frequencies of the signals produced by oscillators 110 and 103 to first decrease and to then increase to a frequency which the filter 180 can pass. This latter value is reached when the lower frequency limit desired for the signal from the variable output oscillator 110 is attained. A beat signal, having a frequency equal to this frequency difference, is now a component of the signal generated by the mixer 150. This component is passed by the filter 180, triggering the bistable multivibrator 170 to its other state of operation. The triangular wave generator 190 thereupon starts to produce a signal of constantly rising voltage and the output signal from the variable output oscillator 110 beings to increase in frequency once again.

In FIG. 4, a circuit of the type generally outlined in FIG. 3 is illustrated. The variable output oscillator 110, the fixed frequency oscillator 130, the mixer 150, and the triangular wave generator 190 are identical to elements 10, 30, 50, and 90, described above. The band-pass filter 180 is similar to the filter 80, but is set to pass a signal having a frequency substantially greater than the low frequency passed by the filter 80. An amplifier 153, similar to the amplifier 53, and rectifiers 173 and 174, arranged to pass only negative-going pulses, are also used. The bistable multivibrator 170 is essentially similar to the bistable multivibrator 70. However, triggering between the alternate states, wherein the stage 172 is alternately conducting and nonconducting, is caused in conventional manner by negative-going pulses from alternate rectifiers 173 and 174 in response to an amplified signal from the amplifier 153 combined with bias signals from the bistable multivibrator applied through resistors 175 and 176.

In operation, the output signal from pentode 116 of the variable output oscillator 110 has a frequency which varies with the voltage input applied from capacitor 194 of the triangular wave generator 190 to the control gird of tube 111. If this voltage input is initially rising in magnitude, i.e., if triode 171 of the bistable multivibrator is initially conducting and triode 172 is nonconducting, the frequency of the output signal from pentode 116 is initially increasing. A signal having, as a component thereof, a frequency representing the difference between the frequency of the output signal from pentode 116, transmitted to the mixer stage 151, and the mean frequency signal from the oscillator 130, transmitted to the mixer tube 152, is continuously generated by the mixer 150. This difference frequency is passed by the filter 180 and amplified by amplifier triode 153 when the desired upper frequency limit for the pentode 116 output waveform is reached. The signal is rectified by rectifier 174 and a resulting negative-going pulse of voltage is coupled to the control grid of triode 171, causing triode 171 to turn off and triode 172 to conduct. The capacitor 194 starts to discharge and the voltage applied to tube 111 commences to decrease. The frequency of the output signal from pentode 116, thus, begins to decrease.

As the frequency of the output signal from the variable output oscillator 110 decreases, the difference frequency component of the signal generated by mixer 150 first decreases, then begins to rise again as the variable output signal frequency becomes less than the frequency of the desired mean frequency signal from oscillator 130. At the lower frequency limit desired for the output signal from tube 116, the frequency of the difference component is again sufficient for the filter 180 to pass this difference signal. This signal is amplified by amplifier 153 and rectified by rectifier 173. A negative-going pulse is delivered to the control grid of bistable multivibrator tube 172 causing tube 172 to become nonconducting. The capacitor 194 begins to charge again and pentode 111 has continuously increasing voltage applied thereto. The frequency of the output signal from pentode 116, thus, starts increasing once more. This is the initial condition stated. The frequency of the pentode 116 output signal will, therefore, continuously vary between the desired upper and lower frequency limits.

It is to be understood that the above-described apparatus is simply illustrative of two embodiments of the invention. One modification of the apparatus might provide any desired nonlinear variations in output frequency, simply through the use of a suitable nonlinear waveform generator in place of the triangular waveform generator. Further, it is to be understood that other electronic components, such as transistors, may be substituted for the various tubes. Many other modifications may be made without departing from the invention.

What is claimed is:

1. In a sweep frequency generator system:

a voltage controlled oscillator for generating an output signal having a frequency proportional to voltage applied thereto;

a first fixed frequency oscillator operable to generate a signal at a first frequency;

a second fixed frequency oscillator operable to generate a signal at a second frequency differing from said first frequency;

means responsive to a first predetermined difference between said first frequency and the frequency of said output signal for coupling to said voltage controlled oscillator a first voltage varying in a first direction effective to move the frequency of said output signal toward said second frequency; and means responsive to a second predetermined difference between said second frequency and the frequency of said output signal for coupling to said voltage controlled oscillator a second voltage varying in a second direction opposite to that of said first voltage to move the frequency of said output signal toward said first frequency.

2. A system for generating a continuous sweep frequency signal which comprises:

a bistable multivibrator responsive to first and second switching signals for providing a square wave output voltage;

means for integrating said bistable multivibrator output to provide a control voltage signal having a triangular waveform;

a voltage controlled ocsillator for providing an output frequency;

means connecting said integrating means to said voltage controlled oscillator for generating a sweep frequency output that varies in accordance with said control voltage signal;

a second oscillator operable at a first constant frequency;

a third oscillator operable at a second constant frequency less than said first constant frequency;

means responsive to a first predetermined difference between said first constant frequency and said output frequency for applying said first switching signal to said bistable multivibrator; and means responsive to a second predetermined difference between said second constant frequency and said output frequency for applying said second switching signal to said bistable multivibrator.

3. A system for generating a continuous sweep frequency signal, as set forth in claim 2, wherein:

said means for applying said first input signal to said bistable multivibrator comprises first mixer means for generating a first signal having a varying frequency equal to the difference between said output frequency of said voltage controlled oscillator and said first constant frequency, and first band-pass filter means responsive to a first predetermined difference in said first signal for applying said first switching signal to said bistable multivibrator; and said means for applying said second input signal to said bistable multivibrator comprises second mixer means for generating a second signal having a varying frequency equal to the difference between said output frequency of said voltage controlled oscillator, and second band-pass filter means responsive to a second predetermined difference in said second signal for applying said switching signal to said bistable multivibrator.

4. In a sweep frequency generator system:

a variable output oscillator means for producing an output frequency signal which varies with a voltage input;

a first fixed frequency oscillator for producing a first signal having a fixed frequency;

a second fixed frequency oscillator operating at a frequency lower than said first fixed frequency oscillator for producing a second signal having a fixed frequency;

first mixer means for receiving the output signal of said variable output oscillator and said first fixed frequency signal from said first fixed frequency oscillator;

second mixer means for receiving the output signal from said variable output oscillator and said second fixed frequency signal from said second fixed frequency oscillator;

a bistable multivibrator responsive to a first switching signal and a second switching signal for producing an output signal;

first band-pass filter means, responsive to a predetermined difference in frequencies of the signals applied to said first mixer means for generating and passing said first switching signal to said bistable multivibrator;

a second band-pass filter means, responsive to a predetermined difference in frequencies of the signals applied to said second mixer means for generating and passing said second switching signal to said bistable multivibrator;

a triangular wave signal generator responsive to the output of said bistable multivibrator for producing a control signal; and means responsive to said control signal varying said voltage input to said variable output oscillator.

References Cited

UNITED STATES PATENTS

| | | | |
|---|---|---|---|
| 2,287,925 | 6/1942 | White | 331—4 |
| 2,434,294 | 1/1948 | Ginzton | 331—4 |
| 2,681,414 | 6/1954 | Strandberg | 331—4 |
| 2,768,293 | 10/1956 | Van Hofweegen | 331—36 |
| 2,811,639 | 10/1957 | Sontheimer | 331—36 |
| 3,076,943 | 2/1963 | Cooperman | 331—36 |
| 3,110,861 | 11/1963 | Hurvitz | 325—335 |
| 3,256,426 | 6/1966 | Roth et al. | 328—127 |

JOHN KOMINSKI, *Primary Examiner.*